United States Patent [19]

Bushnell et al.

[11] Patent Number: 5,422,891
[45] Date of Patent: Jun. 6, 1995

[54] ROBUST DELAY FAULT BUILT-IN SELF-TESTING METHOD AND APPARATUS

[75] Inventors: Michael L. Bushnell, East Windsor; Imtiaz Shaik, New Brunswick, both of N.J.

[73] Assignee: Rutgers University, Piscataway, N.J.

[21] Appl. No.: 96,731

[22] Filed: Jul. 23, 1993

[51] Int. Cl.$^6$ ............................................. G06F 17/50
[52] U.S. Cl. ..................... 371/22.4; 364/488; 364/578; 371/22.1; 371/25.1; 371/27
[58] Field of Search ............... 364/488, 578; 371/22.1, 371/22.4, 25.1, 27

[56] References Cited

U.S. PATENT DOCUMENTS

| | | | |
|---|---|---|---|
| 4,495,621 | 1/1985 | Nakagomi et al. | 371/6 |
| 4,635,261 | 1/1987 | Anderson et al. | 371/27 X |
| 4,656,592 | 4/1987 | Spaanenburg et al. | 364/490 |
| 4,672,307 | 6/1987 | Breuer et al. | 371/25.1 |
| 4,687,988 | 8/1987 | Eichelberger et al. | 371/22.3 X |
| 4,688,223 | 8/1987 | Motika et al. | 371/27 |
| 4,745,355 | 5/1988 | Eichelberger et al. | 371/22.4 X |
| 4,787,062 | 11/1988 | Nei et al. | 364/DIG. 2 |
| 4,801,870 | 1/1989 | Eichelberger et al. | 371/27 |
| 4,893,072 | 1/1990 | Matsumoto | 371/25.1 |
| 4,897,837 | 1/1990 | Ishihara et al. | 371/27 |
| 4,939,677 | 7/1990 | Otuji et al. | 364/569 |
| 4,965,474 | 10/1990 | Childers et al. | 307/465 X |
| 5,023,875 | 6/1991 | Lee et al. | 371/25.1 |
| 5,051,996 | 9/1990 | Bergeson et al. | 371/22.4 |
| 5,056,094 | 10/1991 | Whetsel | 371/25.1 |
| 5,065,090 | 11/1991 | Gheewala | 371/25.1 X |
| 5,091,872 | 2/1992 | Agrawal | 364/578 |
| 5,095,483 | 3/1992 | Dubler et al. | 371/25.1 |
| 5,109,190 | 4/1992 | Sakashita et al. | 371/25.1 X |
| 5,138,619 | 8/1992 | Fasang et al. | 371/21.1 |
| 5,184,067 | 2/1993 | Nozuyama | 371/22.4 X |

OTHER PUBLICATIONS

Design for Testability for Path Delay Faults in Sequential Circuits by Tapan J. Chakraborty, Vishwani D. Agrawal and Michael L. Bushnell (no date).

Delay Fault Models and Test Generation for Random Logic Sequential Circuits, Tapan J. Chakraborty, Vishwani D. Agrawal and Michael Bushnell, 29th ACM-/IEEE Design Automation Conference.

On Delay Fault Testing in Logic Circuits, Chin Jen Lin and Sudhakar M. Reddy, 1987 IEEE Transactions on Computer Aided Design, pp. 694-703.

Model for Delay Faults Based Upon Paths, Gordon L. Smith, 1985 International Test Conference, Paper 9.6, 342-349.

Efficient Test Converage Determination for Delay Faults, J. L. Carter, V. S. Iyéngar and B. K. Rosen, IBM Thomas J. Watson Research Center.

A Delay Test Generator for Logic LSI, Terumini Hayashi, Kazumi Hatayama Katsuya Sato and Takashi Natabe, 1984 IEEE pp. 146-149.

Advanced Automatic Test Pattern Generation Techniques for Path Delay Faults, Michael H. Schulz, Karl Fuchs and Frank Fink, 19th Symposium on Fault-Tolerant Computing 1989 pp. 1-8.

*Primary Examiner*—Edward R. Cosimano
*Attorney, Agent, or Firm*—Mathews, Woodbridge & Collins

[57] ABSTRACT

This invention relates to a method and apparatus for robust delay fault testing of integrated circuits (IC) with built-in self-testing. For the method, hazardous nodes of the IC are determined. Thereafter, the topology of the IC can be modified to include a cut-point at hazardous nodes of the circuit. Input of the IC to the cut-point is diverted to an observation point. An out-put multi-input signature register (MISR) at the observation point generates a first signature. An output MISR provides a second signature for outputs to the IC. During testing, a hazard-free input pattern is applied to the IC and the generated first and second signatures are compared to known correct signatures.

19 Claims, 9 Drawing Sheets

ROBUST DELAY FAULT BUILT-IN SELF-TESTING METHOD AND APPARATUS

BACKGROUND OF INVENTION

1. Field of the Invention

This invention relates to a method and apparatus for built-in self-testing of delay faults in hardware systems. This invention was made with Government support under Grant MIP 9058536, awarded by the National Science Foundation. The Government has certain rights in this invention.

2. Description of the Related Art

Integrated circuits can have permanent faults such as a grounded point or point connected to the positive supply. These permanent faults are often referred to as "stuck-at" faults. Many arrangements have been described for testing stuck-at faults. However, even though a integrated circuit does not have a stuck-at fault it may still not perform accurately when put in service.

A logic circuit may be expected to operate correctly during successive "clock" periods. A "delay-fault" occurs when a circuit response requires more time than specified by design requirements. Delay-fault testing can be used to check if the circuit meets the required clock rates.

Conventionally, stuck-at fault and delay-fault testing can be performed immediately following circuit fabrication with automatic test equipment. External testing of a circuit for delay-faults takes additional time for large circuits to check each path of the circuit. Large circuits require faster test equipment in order to clock the outputs of the circuit under test at the right instant. Typically, automatic test equipment can only test for delays up to 200 mHz. In addition, automatic testing equipment for delay-faults at a frequency of up to 200 mHz is expensive, i.e., typically costing between $750,000 and $1 million.

A method for delay-fault testing is described in U.S. Pat. No. 5,056,094. This patent describes an apparatus for testing the propagation delay between a driving device and a receiving device of an integrated circuit (IC). Test cells are disposed at boundaries of the IC to control data flow through application logic of the IC. The test cell allows input data to be observed and output data to be controlled simultaneously. Sampled input is compared to a known value to determine whether the signal propagated to the receiving device is within the time period between the first and second clock edges.

One conventional approach for testing without automatic test equipment is to add circuitry onto an IC chip for self-testing. The Built-In Self-Testing (BIST) approach enables the circuit to test itself. U.S. Pat. No. 5,138,619 relates to a built-in self-test circuit for on-chip testing of an integrated circuit memory. An address pseudo-random pattern generator (PRPG) selectively furnishes test addresses to memory and a data PRPG selectively furnishes test data to memory. A parallel signature analyzer (PSA PRPG) selectively furnishes data to the memory in normal mode and determines a signature in test mode. A decoder compares the signature determined by the PSA PRPG with a known correct signature and sets a flag to indicate memory pass or fail. This testing method is used for determining stuck-at faults. U.S. Pat. No. 4,801,870 describes a method for testing complex integrated circuit devices. An advance simulation of the testing protocol determines a good signature for the device. Pseudo-random pattern generators supply input test patterns to the device to be tested. Output responses of the device are combined to obtain a test signature. Thereafter, the test signature is compared to the good signature. The method of this patent has the shortcoming of being used only for stuck fault testing.

U.S. Pat. No. 4,672,307 describes a test system for testing combinational logic circuit faults using delay testing. A test input circuit is connected to the combinational logic circuit. The test input circuit has at least as many inputs as the combinational logic circuit. The test input circuit applies a series of all possible single transitions of the combinational logic circuit. This is a set of binary numbers where there is only a one bit transition between successive numbers. For example, a two digit Gray code would be as follows: 00, 01, 11, 10. Validity of the outputs from the combinational logic circuit is checked for correctness during a predetermined time interval. A Gray code generator has the disadvantage that the most significant bit changes only once for the entire sequence. In addition, a Gray code generator has long cycle lengths for circuits with large numbers of primary inputs.

Of possible general relevance are U.S. Pat. Nos. 5,095,483 and 5,051,996 directed to signature comparisons and U.S. Pat. Nos. 4,635,261 and 4,893,072 directed to testing devices for integrated circuits.

Excessive delays in circuits under test are often due to device parameter variations caused by random fluctuations during fabrication of the circuits. Variations in delay characteristics can be found in several devices or paths in the circuit. Accordingly, path delay-faults can be caused by devices not in the tested path. Non-robust delay testing is a test which detects faults under the assumption that only the paths passing through a given delay-fault site can cause excessive path delay and all other paths are delay-fault free. Non-robust delay-fault testing is invalidated if a delay occurs on a path other than the one passing through a given delay-fault site. The above-described patents relate to non-robust testing.

Robust delay testing is used to test for an excessive path delay for a tested path independently of other path delays in the circuit, where the delays are variable or non-existent. It is desirable to provide a method and apparatus for robust delay-fault built-in self-testing of circuits.

SUMMARY OF THE INVENTION

Briefly described, the present invention comprises a method and apparatus for robust delay-fault testing of an integrated circuit (IC) by altering the circuit topology. Hazardous nodes are determined for the IC circuit. A hazardous node is defined as a gate whose output momentarily switches from the correct output value for a brief time period. Cut points are inserted in the circuit for diverting input to the hazardous node to an observation point. In a first embodiment, a succession of input patterns are applied to the IC during testing. Output responses of the IC are processed in a multi-input signature register (MISR) to provide a first signature. Output responses of the IC at the observation point are processed in a cut-point MISR to provide a second signature. The first and second signatures are compared to known correct signatures. In order to ensure fair testing, phase offset delays are added to the drivers of fanouts from hazardous nodes and the clock for the cut-point MISR is phase offset from the system clock.

In a second embodiment, an exclusive OR gate is used at the cut-point. The exclusive OR gate eliminates inputs with opposite transitions for eliminating hazardous nodes during testing. In addition, XOR equivalence gates in the IC are determined in both embodiments and are modified for eliminating inherent hazards.

Cut-points are optimally inserted at common nodes of the IC for the eliminating the addition of excess hardware to the IC. A modified Johnson counter is preferably used for generating hazard-free input patterns.

The invention will be further understood by reference to the following drawings.

DETAILED DESCRIPTION OF THE INVENTION

During the course of this description like numbers will be used to identify like elements according to the different figures which illustrate the invention.

Figure 1:
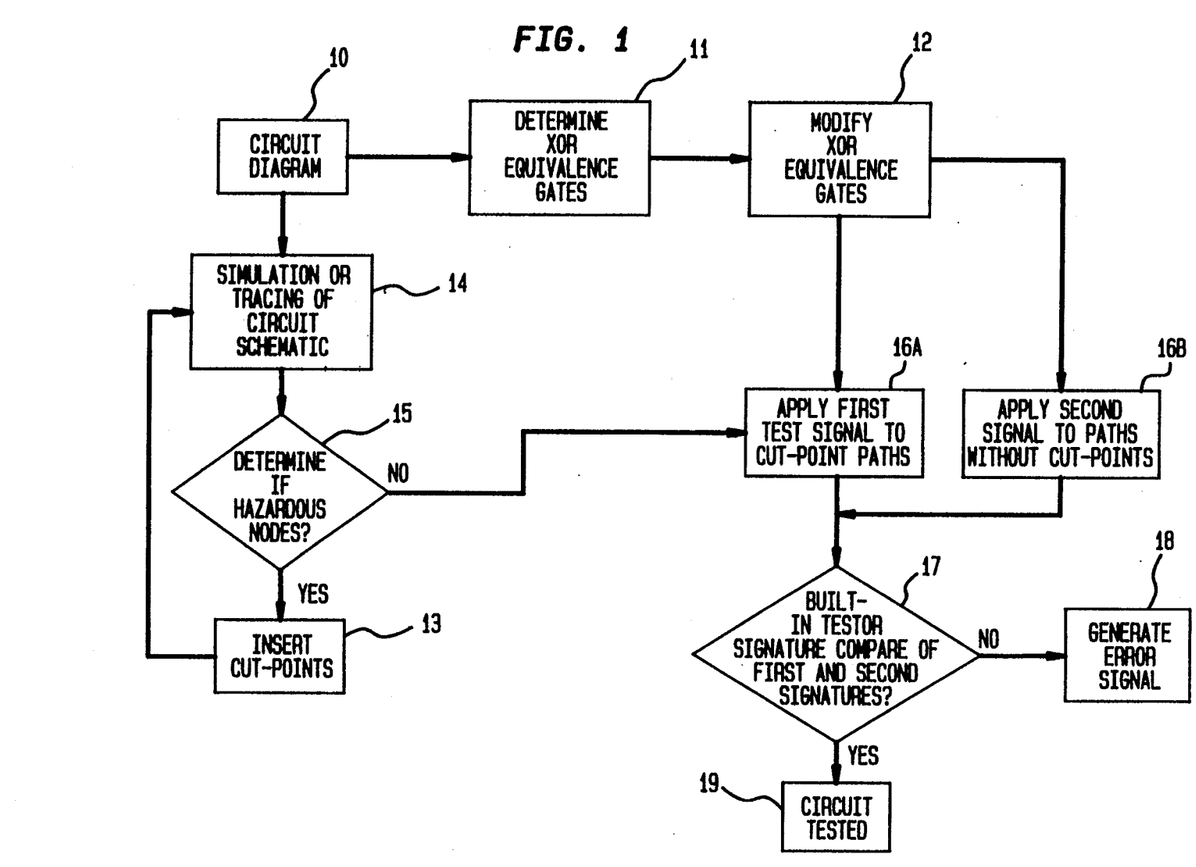
FIG. 1 is a flow diagram of the robust delay-fault testing method in accordance with the principals of the present invention.

FIG. 1 is a flow diagram illustrating the basic concept of the robust delay-fault testing method in accordance with the principles of the present invention. The testing concept is used to enable the circuit hardware to be hazard-free during testing in order to provide accurate robust testing of the circuit. A hazard or hazardous node in a circuit can be defined as a non-Exclusive-OR, non-Equivalence gate having inputs with opposite transitions. For Exclusive-OR and Equivalence gates, we define a hazardous gate or node as one having inputs with more than one transition. Depending on the speed of the transitions of the inputs, both inputs can have simultaneous transitions which can result in inaccurate testing of the circuit. For example, a hazard occurs on an OR gate when one input changes from 0→1 while a second input changes from 1→0. In this case, there can be a momentary instant when the first input has not yet changed to "1" and the second input has changed to "0", therefore, both inputs to the OR gate are "0" and a momentary logic "0" is the OR gate's output.

During testing of the circuit, a transition can be applied to the circuit which propagates through the OR gate and ultimately produces a logic "0" as the OR gate output. However, if the circuit is tested during the momentary logic condition a logic "0" would be produced which would be a false determination of the output condition since the transition had not yet propagated through the system.

XOR and Equivalence gates are inherently sensitive to multiple changes in inputs and are therefore hazard prone. Signal parity is defined as the number of inversions a signal is subject to as it travels along a path. It is difficult to judge the parity of an XOR or Equivalence gate since a signal passing through one of the inputs of an XOR gate can either pass as it is or can be inverted depending upon the signal on the other input. An XOR gate is hazard prone even if there are similar transitions on the inputs.

Paths in the circuit which are responsible for hazards are cut in order to achieve the objective of the robust testing concept. A path is cut by inserting a cut-point on any of the lines of the path. For example, when a cut-point is inserted between lines connecting two nodes X and Y of the circuit, the cut-point prevents a signal at X from feeding Y in the test mode of the circuit. Instead, the signal of X is diverted to an observation point and Y is driven from a new hazard-free signal generated by an input pattern generator.

A circuit diagram 10 is generated which illustrates the circuit under test. Circuit diagram 10 includes all internal functional elements and all interconnections between the input and output terminals of the circuit under test; i.e., AND gate, OR gate, NOR gate, NAND gate, or the like. Preferably, the circuit diagram is a logic model contained in a computer memory.

Module 11 determines if any XOR or Equivalence gates are present in circuit diagram 10. XOR and Equivalence gates are modified in block 12 for providing definite signal parity between the input node and the output node, thereby eliminating hazards in the XOR and Equivalence gates.

Simulation or tracing of the circuit diagram 10 is performed in block 14 to determine if hazardous nodes are present in schematic diagram 10. If a hazard is determined, block 15 produces a "YES" and block 12 is executed. If a hazard is not determined, block 15 produces a "NO" and apply test signal block 16 is executed. A cut-point is inserted in block 13 to eliminate one or more of the detected hazardous nodes. A cut-point is inserted in an input path of a hazardous node for preventing the input signal from propagating through the hazardous node. After a cut point is inserted in block 13 simulation or tracing is repeated in simulation or tracing in circuit schematic block 15 until no more hazardous nodes are found in the circuit under test.

During testing of the circuit a first signal is applied in block 16A to cutpoint paths and a second test signal is applied to paths without cutpoints in block 16B for activating the cut-points and activating a hardware input generator for performing robust delay testing. In a tester signature compare module 17, a hazard-free input pattern is applied to primary inputs of the circuit as well as to inputs of cut-points to generate a first and second signatures in order to avoid hazards in the response. A hazard-free input pattern can be defined as a sequence of input vectors that differ successively by one bit. The hazard-free input pattern initiates only one transition at any one of the primary inputs while all other primary inputs are held at a constant value. A hazard-free input pattern is a sequence that avoids multiple transitions on inputs to the circuit under test.

A hazard-free input pattern can be generated by a Gray code generator or a Johnson counter. A Gray code counter has the disadvantage that for large numbers of inputs the cycle time is too large for practical testing. A Johnson counter generates 2n basic patterns. A Johnson counter has the disadvantage of not supplying sufficient patterns for all fault sites in the circuit. Preferably, a modified Johnson counter including controlled complementation of the Johnson counter outputs is used for providing sufficient numbers of hazard-free input patterns.

After the hazard-free input pattern is applied to the circuit, primary outputs are checked with a multiple input signature register for comparing the outputs to a correct value during any clock period. Outputs from the cut-points at the observation point are checked with a second multiple input signature register. If a wire or gate is too slow, then a signal being sampled by tester signature compare module 17 will be incorrect. If the signature has an incorrect value an error signal will be generated in block 18 and if the signature has a correct value the circuit testing is complete and the circuit is tested in module 19.

Figure 2:
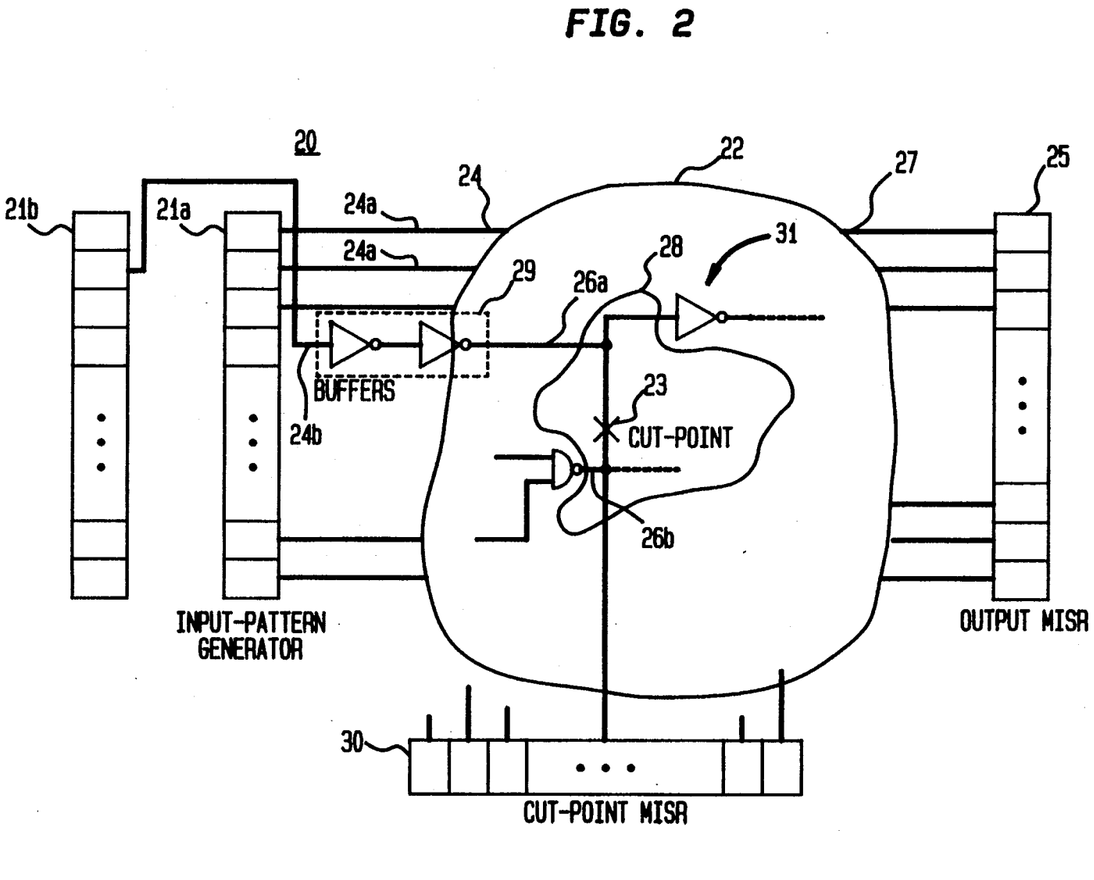
FIG. 2 is a schematic diagram of a robust delay-fault testing system in accordance with the principals of the present invention.

FIG. 2 illustrates an apparatus for a robust delay-fault built-in self-testing (BIST) system 20 in accordance with the principles of the present invention. In BIST system 20, test vector generation and test result verification are accomplished by built-in circuitry. Input pattern generators 21 are disposed at the boundary of integrated circuit (IC) 22 to generate an input pattern for testing IC 22. Primary inputs 24 extend between input pattern generator 21 and IC circuit 22.

Input pattern generator 21a generates ordinary input 24a and input generator 21b generates input 24b. Inputs 24a are applied to path 24a without cutpoints 23 and input 24b is applied to paths 24b with cutpoints 29. Ordinary primary inputs 24a which are not hazard prone are connected to IC22. Primary input 24b is connected by path 26a to hazardous node 28. A cut-point 23 is inserted in hazardous node 28 to direct input from path 26b to an observation point which is a cut-point multiple input signature register (MISR) 30. Outputs 27 of IC 22 are received at output MISR 25. Hazard-free input patterns are generated by input pattern generator 21 and are applied to primary inputs 24 and cut-point 23 during testing. A new bit of hazard-free input pattern is applied to fanout circuit 31 through path 26a in test mode. After application of the hazard-free input pattern, responses from IC 22 are combined in output MISR 25. Output MISR 25 receives a succession of input responses from primary outputs 27 of IC 22 and produces a derived function thereof or first signature. Responses for cut-points 23 are combined in cut-point MISR 30 for providing a second signature.

Buffers 29 can be inserted in primary input path 24b in order to delay the hazard-free input pattern sufficiently to fairly test the primary input paths which are connected to a cut-point. It has been found that a transition in the hazard-free input pattern applied to primary input path 24b will arrive more quickly at output MISR 25 than a transition from an ordinary primary input 24a will arrive at output MISR 25. A signature computed at cutpoint MISR 30 may not catch a delay-fault, if the fault is of a size large enough to delay the path from primary input 21 to output MISR 25. A delay-fault between input generator 21 and output MISR 25 can be larger than a delay-fault between cut-point 23 and output MISR 25. A signature computed for the delay-fault between input signature generator 21 and output MISR 25 would not catch the shorter delay-fault of cut-point 23. The number of buffers 29 used in system 20 depends on the computed nominal delay of each path driven from cut-point 23 to output MISR 25. Buffers 29 delay the transition sufficiently so that a signature can be effectively evaluated by output MISR 25.

Figure 3:
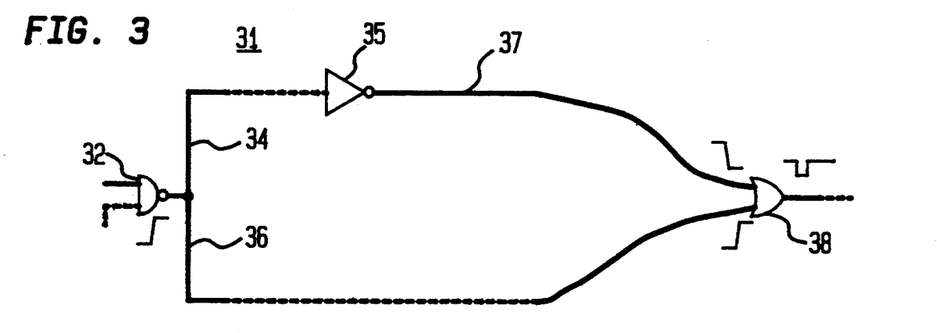
FIG. 3 is a schematic diagram of a reconvergent fanout circuit.

FIG. 3 illustrates an example of a hazardous node 38 which is a reconvergent fanout circuit 31. Reconvergent fanout circuit 31 splits into at least two paths before it reconverges at another point in the circuit. Signal parity can be defined as the number of inversions a signal is subject to as it travels along a path. A reconvergent fanout circuit can have a hazard if the paths are of opposite signal parity. Output paths 34, 36 from NAND gate 32 reconverge at OR gate 38. Path 34 is inverted with inverter 35 to produce odd signal parity on path 37. Path 36 from NAND gate 32 has even signal parity. Hazardous node 38 is an OR gate. A hazard can occur at hazardous node 38 since path 37 has opposite signal parity to path 36. Path 36 or path 37 can be cut to avoid a hazard at hazardous node 38. If there are more than two paths reconverging, then we cut either all odd parity paths or all even parity paths.

Figure 4:
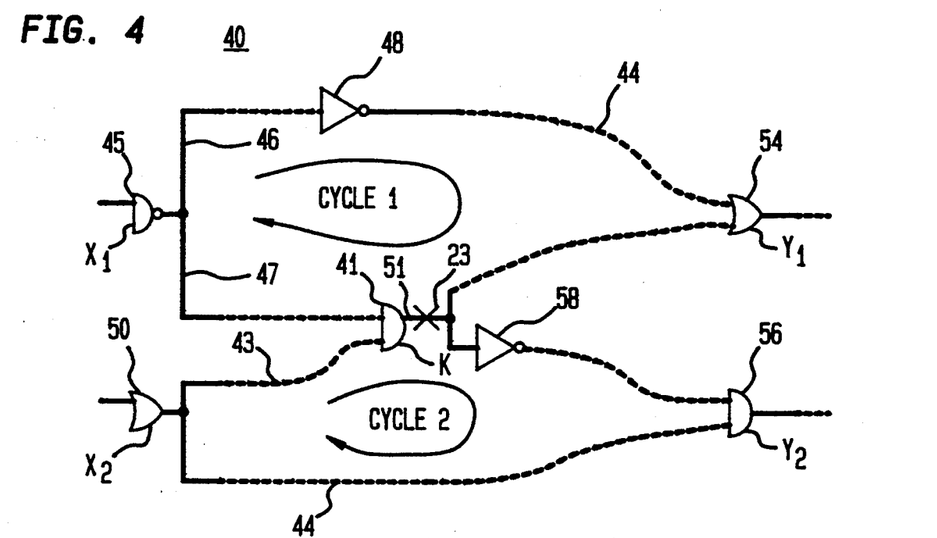
FIG. 4 is a schematic diagram of a reconvergent fanout circuit with a common node.

It has been found that inserting cut-points in every reconverging pair may result in inserting too many cut-points into IC 22. Preferably, cut-points are inserted at minimal locations in IC 22 for providing minimal additional hardware to the IC. FIG. 4 illustrates a reconvergent fanout 40 with the minimal number of cut-points inserted. IC 22 can include a reconvergent fanout 40 that includes one or more "K" common nodes 41. Cycle 1 starts from $X_1$ source node 45, traverses paths 46 and 44 to $Y_1$ end node 54 and returns back to the $X_1$ source node 45 along path 47 in the opposite direction. Cycle 2 starts from $X_2$ source node 50, traverses path 43 to $Y_2$ end node 56 and returns along path 44 in the opposite direction. Node 41 is common to cycles 1 and 2. The number of cycles "n" that intersect at node K means that node K will have at least n fanout lines. A cut-point is inserted at the fanout stem of node K in order to cut off "n" fanout lines from node K's output and thereby save n−1 cut points from the hardware overhead of the IC.

$X_1$ source node 45 is a NAND gate which includes output paths 46 and 47. $X_2$ source node 50 is a OR gate which includes output paths 43 and 44. Output path 46 is received at inverter 48 which provides input 44 to the $Y_1$ end node. $Y_1$ end node 54 is an OR gate. Output paths 47 and 43 provide input to node 41. Output 51 from node 41 is received at $Y_1$ end node 54 and inverter 58. Inverter 58 provides input to $Y_2$ end node 56. Preferably, cutpoint 23 is inserted after node 41 between $Y_1$ end node 54 and inverter 58 for cutting input to both $Y_1$ end node 54 and $Y_2$ end node 56 with the minimal number of cut-points.

Figure 5:
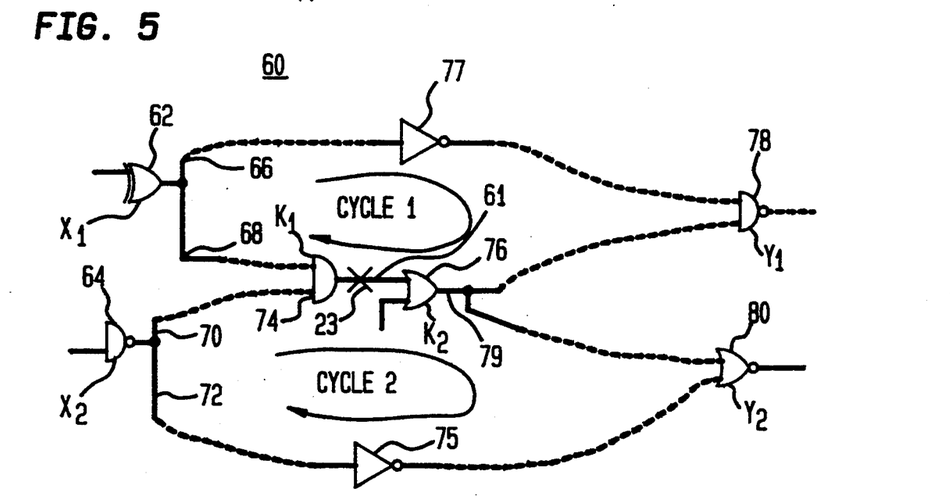
FIG. 5 is a schematic diagram of a reconvergent fanout circuit with two common nodes.

FIG. 5 illustrates a reconvergent fanout circuit 60 with $K_1$ node 74 and $K_2$ node 76 in common. Path 61 is shared by cycles 1 and 2. Inserting cut-point 23 between nodes 74 and 76 is optimal for reducing hardware overhead.

$X_1$ source node 62 is an exclusive OR which includes output paths 66 and 68. Path 66 provides input to inverter 77 which provides input to $Y_1$ end node 78. $Y_1$ end node 78 is a NAND gate. $X_2$ source node 64 is a NAND gate which includes output paths 70 and 72. Output path 68 and output path 70 are received at node 74. Node 74 is an AND gate and node 76 is an OR gate. Path 72 provides input to inverter 75 which provides input to $Y_2$ end node 80. $Y_2$ end node 80 is a NOR gate. Output 61 from node 74 provides input to node 76. Output 79 from node 76 provides input to $Y_1$ end node 78 and $Y_2$ end node 80. Preferably, cut-point 23 is inserted in path 61 between node 74 and node 76. In this arrangement input paths to node $Y_1$ end node 78 and $Y_2$ end node 80 are cut by the insertion of cut-point 23. A cut-point can be inserted anywhere on the reconvergent opposite parity paths. Accordingly, cut-points can be inserted away from critical paths of the circuit 2.

Figure 6:
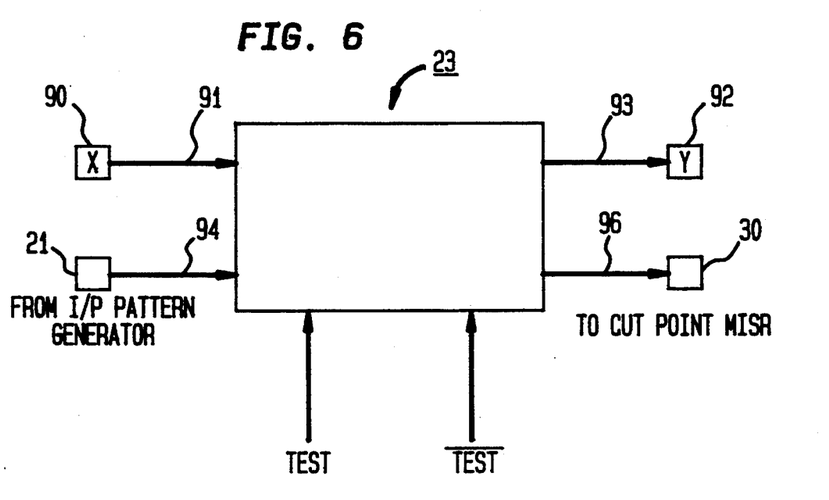
FIG. 6 is a block diagram of a cut-point circuit.

FIG. 6 is a block diagram of cut-point 23 inserted between X input node 90 and Y output node 92. Output 91 from input node 90 is connected to cut-point 23 and output 93 of cut-point 23 is connected to output node 92. Output 94 from input pattern generator 21 is connected to cut-point 23 and output 96 from cut-point 23 is connected to cut-point MISR 30. Control inputs TEST and $\overline{TEST}$ are applied to cut-point 23 to respectfully provide or remove connections of cut-point 23 between input node 90 and output node 92.

Figure 7:
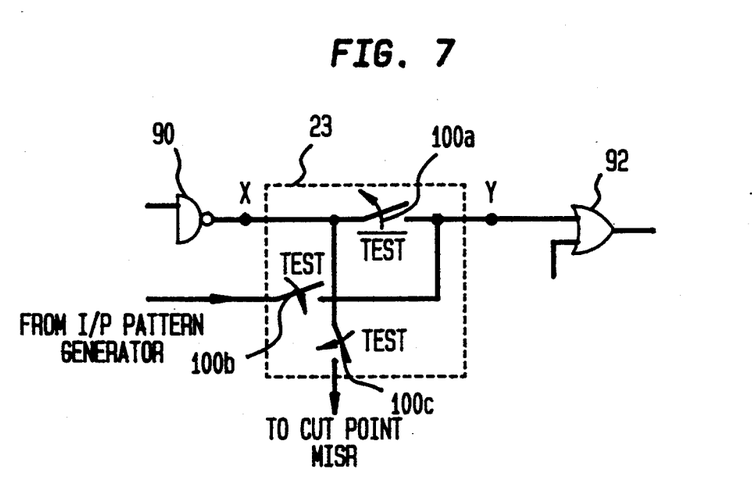
FIG. 7 is a schematic diagram of a cut-point circuit with applied control signals.

FIG. 7 illustrates a circuit diagram of cut-point 23 including test switches 100a, 100b and 100c. A control input of $\overline{TEST}$ is supplied to test circuit 100a for closing circuit 100a during normal operation of IC 22. A control input of TEST is applied to circuits 100b and 100c for closing circuits 100b and 100c when IC 22 is in a test mode.

Figure 8A:
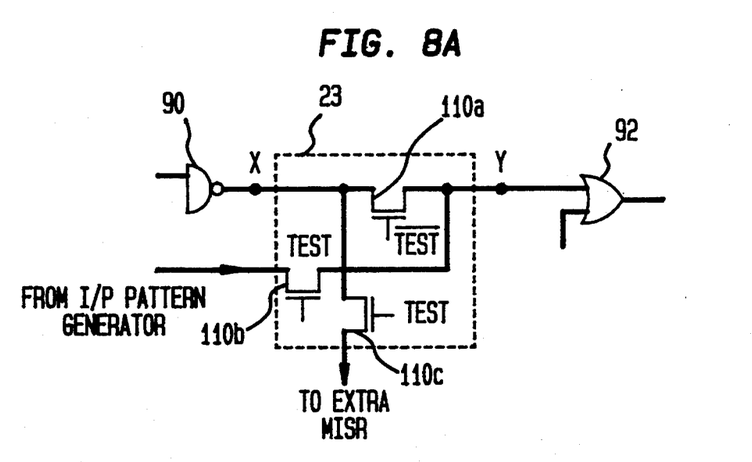
FIG. 8A is a schematic diagram of a NMOS implementation of a cut-point circuit.
Figure 8B:
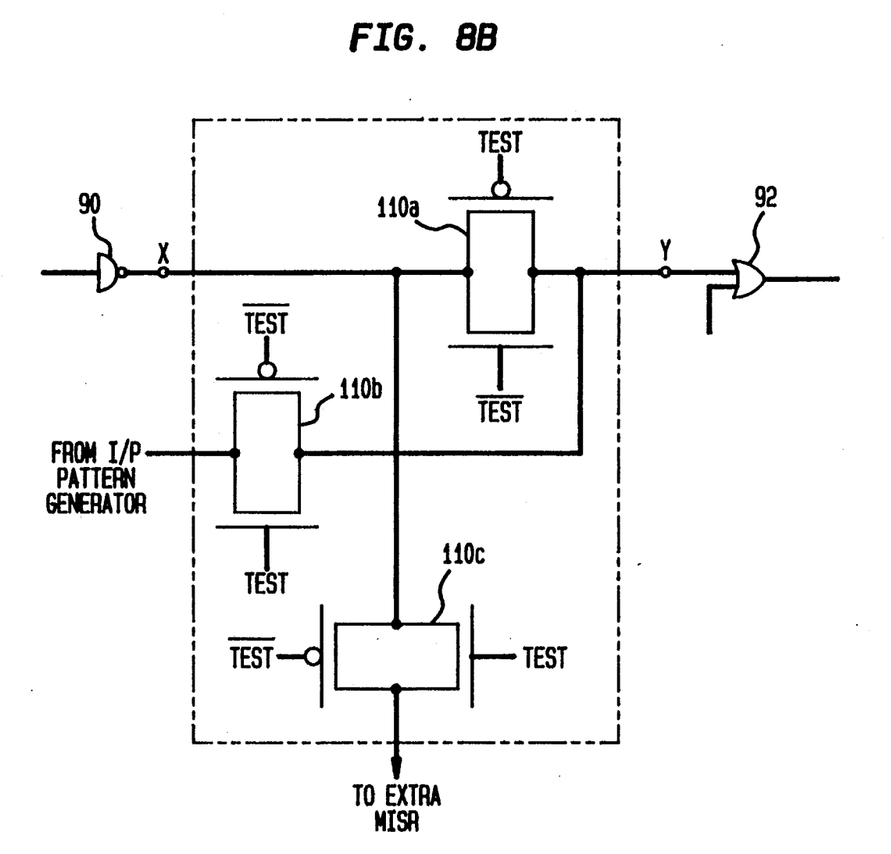
FIG. 8B is a schematic diagram of a CMOS implementation of a cut-point circuit.

FIG. 8A illustrates implementation of cut-point 23 in a NMOS MOSFET logic system. FIG. 8B illustrates implementation of cut-point 23 in a complementary MOSFET (CMOS) logic system. $\overline{Test}$ is applied to transistor 110a during normal operation of IC 22. TEST is applied to transistors 100b and 110c during TEST mode of IC 22. It will be appreciated that other logic systems such as TTL, ECL, BiCMOS and it will be appreciated that other logic systems known in the art can be used with the teachings of the present invention.

Figure 9:
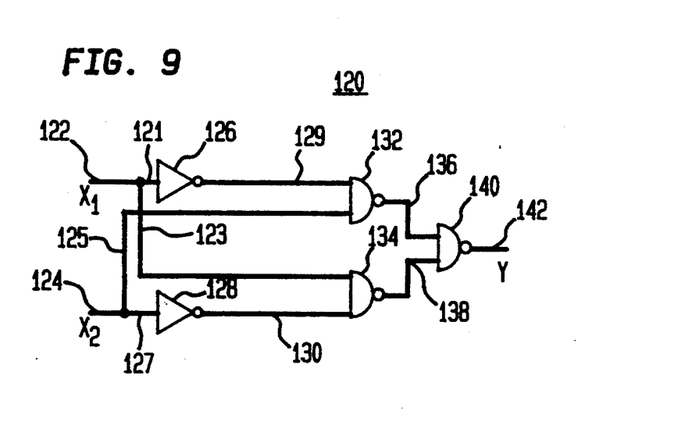
FIG. 9 is a schematic diagram of a NAND realization of an XOR gate.

FIG. 9 illustrates a NAND implementation 120 of an XOR Equivalence gate. $X_1$ source node 122 and $X_2$ source node 124 have two reconverging paths to Y end node 142 with one inverted and one non-inverted path. Path 123 from node 122 is non-inverted and path 121 from node 122 is inverted with inverter 126. Path 125 from node 124 is non-inverted and path 127 is inverted with inverter 128. Paths 129 and 125 are applied to NAND gate 132 and paths 123 and 130 are applied to NAND gate 134. Outputs 136 and 138 are applied to NAND gate 140 which provides output 142 to Y end node 142.

Figure 10:
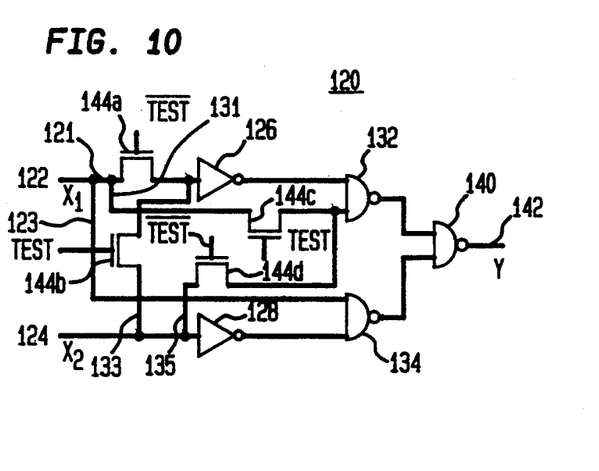
FIG. 10 is a schematic diagram of a hardware modified XOR gate as shown in FIGS. 9 including CMOS switches.

FIG. 10 illustrates a hardware modification of the NAND implementation of the XOR gate 120 in an NMOS implementation. Four NMOS switches are used to change the configuration of the XOR gate 120 such that source node $X_1$ has only non-inverting paths to end node Y and source node $X_2$ has only inverting paths to node Y. NMOS switches 144a, 144b, 144c and 144d are inserted to change the configurations of NAND gates 132 and 134 so that input 122 has non-inverting paths to end node 142 and input 124 has inverting paths to end node 142. NMOS switch 144a is inserted in the path 121 from node 122 to inverter 126 and NMOS switch 144b is inserted in path 133 from node 124 to inverter 126. NMOS switch 144c is inserted in path 131 from node 122 to NAND gate 132 and NMOS switch 144d is inserted in path 135 from node 124 to NAND 132.

Figure 11:
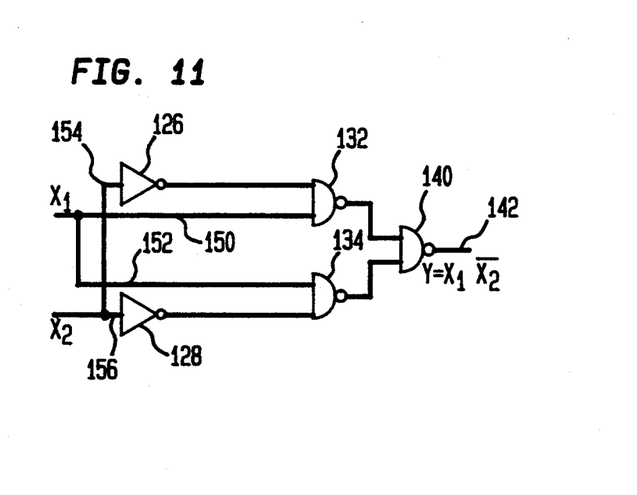
FIG. 11 is a schematic diagram which is equivalent to FIG. 10 when a TEST signal is applied to the circuit under test.

FIG. 11 illustrates an equivalent diagram of FIG. 10 with a control signal TEST asserted. If node $X_1$ is input and node $X_2$ is input the logic function for the circuit is $Y = X_1 \overline{X_2}$. Paths 150 and 152 from node $X_1$ provide non-inverted inputs to NAND gates 132 and 134 and paths 154 and 156 are inverted with respective inverters 126, 128 to provide inverted inputs to gates 132 and 134. Paths from $X_1$ and $X_2$ to Y have definite signal parity.

Figure 12:
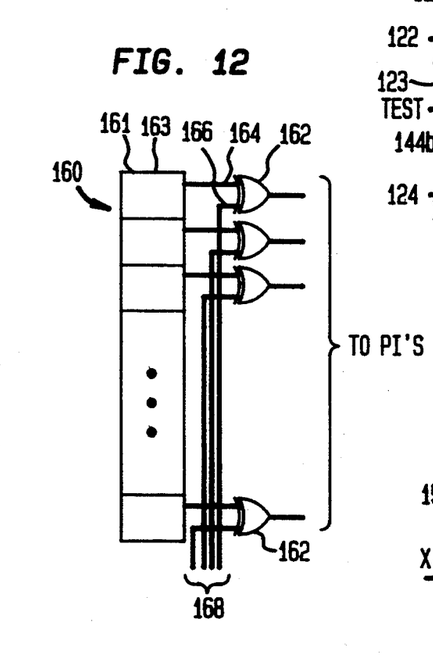
FIG. 12 is a schematic diagram of an input generator for providing a modified Johnson counter.

FIG. 12 illustrates input pattern generator 160 for generating hazard-free input patterns which can be used for input pattern generator 21, shown in FIG. 2. A test pattern is a sequence of vectors in which each element, which represents the logic value to be given the primary inputs, takes one of the values, 0, 1, a falling transition or a rising transition. Input pattern generator 160 is a modified Johnson counter for providing more than 2n patterns. Single bits of the pattern are selectively inverted to result in a new pattern. Outputs 164 of Johnson counters 161 are applied to a linear array of two-input XOR gates 162. Input 166 of XOR gate 162 receives a control signal from input lines 168. If a high control signal is received at XOR gate 162 a corresponding bit of the Johnson counter 163 is complemented. For example, if the output of Johnson counter is 11111 and a complement is applied to the most significant bit the pattern applied would be 01111 and if no complement is applied the pattern would be 11111. In the modified Johnson counter, generated patterns cyclically alternate between complemented patterns and uncomplemented patterns to produce successive one-bit transition changes. An illustration of a modified Johnson scheme is shown in Table 1.

TABLE 1

| \multicolumn{3}{c}{CONTROLLED SWITCHING FOR SINGLE-BIT COMPLEMENTATION SCHEME} | | |
| --- | --- | --- |
| Output of Johnson Counter | Operational Mode | Pattern Applied |
| 11111 | C (Bit 4) | 01111 |
|  | NC | 11111 |
| 01111 | NC | 01111 |
|  | C (Bit 4) | 11111 |
| 00111 | C (Bit 4) | 10111 |
|  | NC | 00111 |
| 00011 | NC | 00011 |
|  | C (Bit 4) | 10011 |
| 00001 | C (Bit 4) | 10001 |
|  | NC | 00001 |
| 00000 | NC | 00000 |
|  | C (Bit 4) | 10000 |
| 10000 | C (Bit 4) | 00000 |
|  | NC | 10000 |
| 11000 | NC | 11000 |

TABLE 1-continued

CONTROLLED SWITCHING FOR SINGLE-BIT
COMPLEMENTATION SCHEME

| Output of Johnson Counter | Operational Mode | Pattern Applied |
|---|---|---|
|  | C (Bit 4) | 01000 |
| 11100 | C (Bit 4) | 01100 |
|  | NC | 11100 |
| 11110 | NC | 11110 |
|  | C (Bit 4) | 01110 |
| 11111 | C (Bit 4) | 01111 |
|  | NC | 11111 |

C (Bit 4) - Complement bit —4
NC - No complement

Each bit complemented produces 2×(# of Johnson counter patterns)

*or* $2 \times (2n) = 4n$ *patterns*

A pair-wise complementation scheme can be used to generate non-hazardous input patterns. In a pair-wise scheme two bits can be complemented simultaneously. For example, the third and fourth bits can be selected for complementation. An uncomplemented pattern of the third and fourth bits is applied as the first pattern. The fourth bit is complemented as the second pattern. The third bit complemented along with the fourth bit as the third pattern. The fourth bit is uncomplemented and the third bit is complemented for the fourth pattern and both the third and fourth bits are uncomplemented for the fifth pattern. A pair-wise complementation scheme has a cycle length of 5×2n patterns. It will be appreciated that other complementation schemes can be used for generating hazard-free input patterns.

Figure 13:
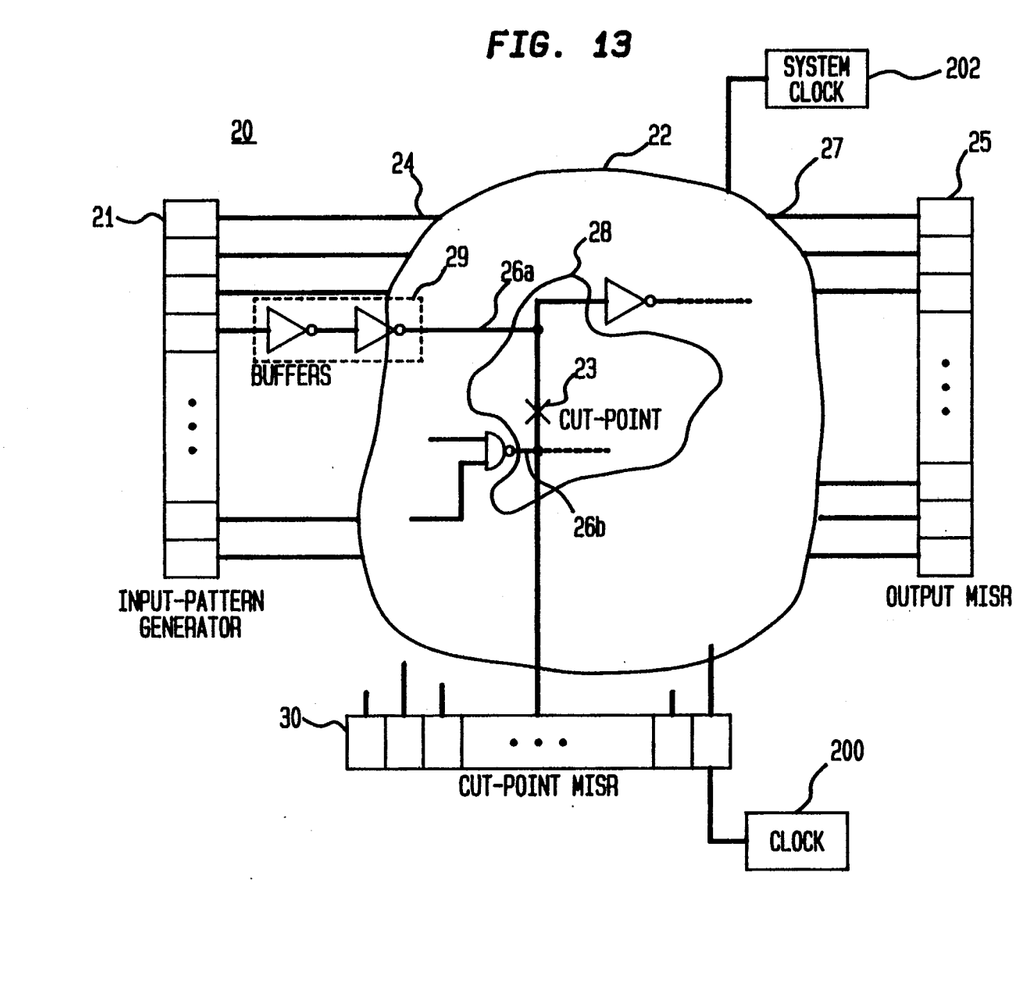
FIG. 13 is a schematic diagram of the robust delay-fault testing system shown in FIG. 2 including clocks.

FIG. 13 illustrates system 20 including clock 200 for cut-point MISR 30. A signal from path 26b to cut-point MISR 30 can arrive before a signal from primary inputs 24 to output MISR 25 on path 26a. Cut-point MISR 30 should be clocked at the right instant for evaluating a fair signature in cut-point MISR 30 which reflects the exact delay of the paths which have been cut. Clock 200 operates at an earlier instant than system clock 202 of IC 22. Preferably, clock 200 is offset by a phase that depends on the overall delay of paths being cut at cut-points 23.

In a first embodiment, a simulation of BIST system 20 is used to determine hazardous nodes and for optimally analyzing the insertion of cut-points 23 into BIST system 20. A hazard modelling algebra can be used for simulating the hazardous nodes of the circuit under test. Preferably, Chakraborty's 13-valued hazard-modeling algebra can be used for modeling BIST system 20 as described in T. J. Chakraborty, Vishwani D. Agrawal and M. L. Bushnell, "Path Delay Fault Testing For Logic Circuits," *Proceedings of the 29th Design Automation Conference.* p. 165-172, June 1992. In this algebra, logic values of two consecutive clock periods are described by a transition state. Three signal states (0, 1, and X) represent nine transition states and eighteen transitions with a hazard or no-hazard condition. These eighteen values eventually collapse into thirteen unique values and each is represented by a triplet. For example, 1|h|0 represents a logic 1 to 0 transition with a hazard in between, while 1|nh|0 represents the same transition with no hazard. Table 2 shows the various transition states with a corresponding numerical encoding. The symbol '~' in the table stands for a condition where a hazard may or may not be present (unknown status). Other hazard capturing algebras that can be used in the present invention are described as: Smith Algebra, "Model for Delay Faults Based Upon Paths" Gordon L. Smith, IBM, *Proceedings of the 1985 International Test Conference,* pp. 342-349, 1985; Reddy Algebra, "On Delay Fault Testing in Logic Circuits" C. J. Lin and S. M. Reddy, *IEEE Transactions on Computer Aided Design,* 6(5): 694-703, Sept., 1987; and Schulz et al Algebra, "Advanced Automatic Test Pattern Generation Techniques for Path Delay Faults", M. H. Schulz, F. Fuchs, and F. Fink, *Proceedings of the 19th Symposium on Fault-Tolerant Computing,* pp. 44-51, June 1989.

TABLE 2

THIRTEEN-VALUED ALGEBRA

| Values | Codes |
|---|---|
| 0 \| h \| 0 | 1 |
| 0 \| h \| 0 | 2 |
| 0 \| ~ \| X | 3 |
| 1 \| h \| 0 | 4 |
| 1 \| h \| 1 | 5 |
| 1 \| ~ \| X | 6 |
| X \| ~ \| 0 | 7 |
| X \| ~ \| 1 | 8 |
| X \| ~ \| 1 | 9 |
| 0 \| nh \| 0 | 10 |
| 0 \| nh \| 1 | 11 |
| 0 \| nh \| 1 | 12 |
| 0 \| nh \| 0 | 13 |

A truth table for each type of gate is implemented in the simulation for determining output values. For example, for a AND gate, if two opposite transitions without a hazard are input, the output must contain a hazard value. During circuit simulation, a modified Johnson pattern sequence is applied to simulated inputs to determine hazardous nodes. If a hazardous node is found, paths leading to the hazardous node are traced to the primary input that had a transition for finding paths with opposite transitions. A signature is generated by the simulation and compared with a correct value.

Figure 14:
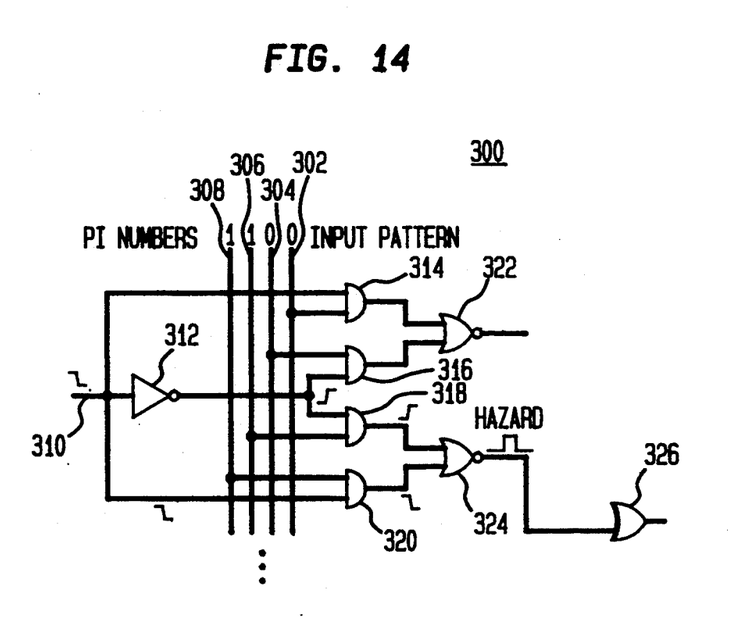
FIG. 14 is a schematic diagram of a circuit showing how application of a hazard-free input pattern to a circuit may still generate hazards in the response. The figure illustrates the tracing of hazardous nodes using a simulation-guided approach.

FIG. 14 illustrates on apparatus 300 simulation guided path tracing by applying hazard-free input patterns for determining hazardous nodes. Hazardous nodes are determined by following transitions through IC 22. A hazard-free input pattern "1100" is applied to primary inputs 302, 304, 306 and 308. A falling transition is applied to primary input 310 which is inverted by invertor 312 and is applied to AND gates 316 and 318 which results in a hazard at NOR gate 324. Path searching starts with primary input 310 through AND gates 318 and 320 to NOR gate 324. Paths leading to AND gate 314 and NOR gate 322 are avoided since there are no transitions on them.

Results for robust delay-fault testing with BIST system are shown in Table 3.

TABLE 3

DELAY FAULT BIST
COVERAGES FOR TEST CIRCUITS

| Circuit | Initial Sizes | | | Robust Delay Fault Coverage |
|---|---|---|---|---|
|  | # Gates | # PI's | # PO's |  |
| Roth | 8 | 4 | 3 | 100% |
| Smith | 6 | 6 | 2 | 100% |
| c17 | 6 | 5 | 2 | 100% |
| ALU181 | 58 | 14 | 8 | 97.69% |
| c432 | 160 | 36 | 7 | 99.89% |
| c880 | 383 | 60 | 26 | 99.46% |

Total
Cut-                           Final Sizes

TABLE 3-continued

| Circuit | Points Added | # Gates | # PI's | # PO's |
|---|---|---|---|---|
| Roth | 2 | 10 | 6 | 5 |
| Smith | 0 | 6 | 6 | 2 |
| c17 | 1 | 7 | 6 | 3 |
| ALU181 | 8 | 74 | 22 | 16 |
| c432 | 12 | 190 | 48 | 19 |
| c880 | 42 | 425 | 102 | 68 |

In a second embodiment, hazardous nodes are identified by enumerating the dominated gates in the circuit. For example, gate A dominates gate B if all paths from A to a circuit output flow through gate B. Gate A can be defined as a dominator. After dominators in IC 22 have been identified, a graph algorithm can be used to enumerate paths in the circuit between dominators to trace IC 22. From the graph algorithm, the points in the circuit in which a cut-point should be inserted can be determined. Parity is assigned to each path of IC 22. If a node is encountered more than once it is assigned a parity of either "ALL EVEN" indicating all paths were even, "ALL ODD" indicating all paths were odd or "BOTH" indicating a mixture of even and odd parity paths.

Figure 15:
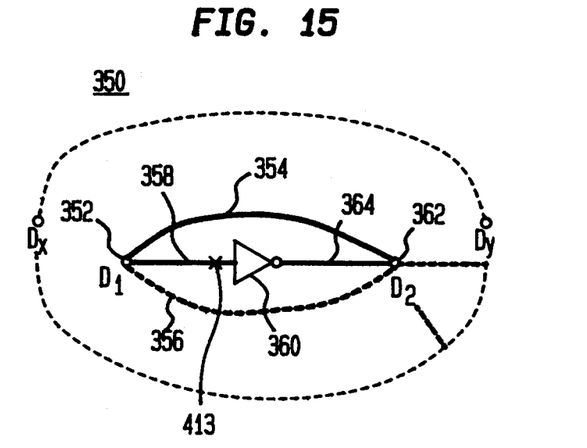
FIG. 15 is a schematic diagram of a graph algorithm for tracing a reconvergent fanout circuit.

FIG. 15 illustrates a use of a graph algorithm system 350 for tracing fanout circuit 31 shown in FIG. 3. Inverter 360 provides ODD parity to path 358. $D_1$ dominator 352 has path 364 which is assigned ODD parity due to inverter 36. Paths 354 and 356 to $D_2$ dominator 362 are assigned EVEN parity. $D_2$ dominator 362 has a parity defined as BOTH which is a hazardous node. The parity at $D_2$ dominator 362 is fixed at ODD or EVEN by a decoupling paths between $D_1$ dominator 352 and $D_2$ dominator 362. A cut-point 413 is inserted in path 358 for decoupling the paths between $D_1$ and $D_2$.

If a node $D_y$ in a fanout region of another node includes node $D_2$ dominator 362 which has a parity of BOTH, node $D_y$ is assigned a party of "SHADOW". Parity of SHADOW is defined as a node which is not considered in the current pass of graph analysis. Paths to node $D_y$ will not be considered in the current pass until the parity of $D_2$ is decided to be either ODD or EVEN. ODD and EVEN parity paths are grouped starting and ending at the same nodes to avoid duplicating these paths for nodes driven by the same node.

Figure 16:
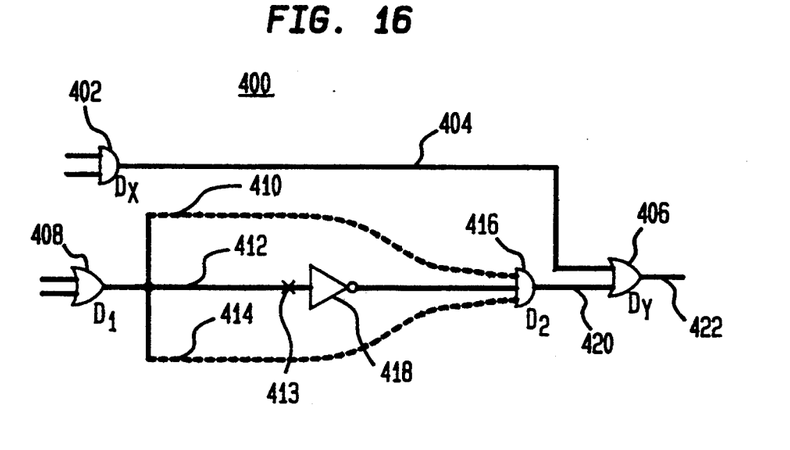
FIG. 16 is a schematic diagram of a graph algorithm for tracing a reconvergent fanout circuit.

FIG. 16 illustrates a graph algorithm for tracing circuit 400. $D_x$ dominator 402 has path 404 to $D_y$ dominator 406. $D_1$ dominator 408 has paths 410, 412 and 414 to $D_2$ dominator 416. $D_2$ is a dominator and is connected to the $D_y$ dominator with path 420 and output 422 is connected to $D_y$ dominator. Paths 410 and 414 have EVEN parity. Inverter 418 provides ODD parity to path 412. $D_2$ dominator 416 is assigned parity BOTH. In the current pass of the graph algorithm, $D_y$ dominator 406 is assigned parity SHADOW. A cut-point 413 can be inserted in path 412 for decoupling $D_1$ dominator 402 and $D_2$ dominator 406 to provide EVEN parity to $D_2$ dominator 402. After cut-point 413 is inserted, $D_y$ dominator 406 will have EVEN parity.

Nodes which decouple the maximum number of paths are chosen for the insertion of cut-points. A group of EVEN parity paths with m ODD parity paths and n EVEN parity paths form a path group equivalent to mxn path pairs. If a cut-point is inserted in an EVEN (ODD) parity path, it is equivalent to decoupling m(n) path pairs. Weights are assigned to nodes of the path group to determine the optimum node to insert a cut-point. Each node in an EVEN (ODD) parity path is assigned weight m(n). If the node is also in other path groups, the node weight is computed by adding all path group weights.

After a cut-point is inserted at a node, all paths of the node are determined to be hazard-free. If additional paths in the circuit are present, weights for insertion of additional cut-points are calculated and additional cut-points are inserted. The graph algorithm is continued until the entire circuit has been traced.

Figure 17:
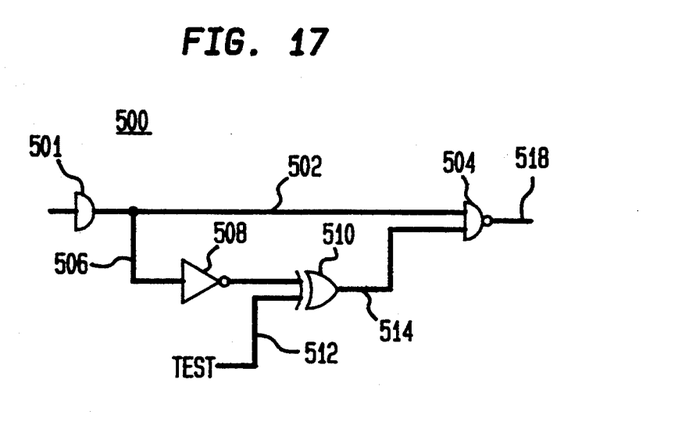
FIG. 17 is a schematic diagram of the insertion of an exclusive OR gate in a circuit for eliminating hazards in the circuit during testing.

FIG. 17 illustrates an alternative to using cut-points to eliminate hazardous nodes in IC 22 in block 13 of FIG. 1. Fanout circuit 500 includes AND gate 501 connected by path 502 to NAND gate 504. PATH 506 is inverted with inverter 508. Exclusive OR gate 510 is inserted in path 508 to eliminate hazards in fanout circuit 500. Exclusive OR gate 510 has input 508, TEST input 512 and output 514. Output 518 is connected to NAND gate 504. Output 514 is received at NAND gate 504.

In normal operation of circuit 500, a TEST signal of "0" is applied to input 512. The signal on input 508 will be the same as the signal on output 514. The NAND gate will have ODD parity from path 502 and EVEN parity from path 514 and is a hazardous node. During testing, TEST signal is set to "1". Exclusive OR gate 510 inverts path 508 to EVEN parity to eliminate a hazardous node in NAND gate 504.

The use of an Exclusive OR gate for eliminating hazards has the advantage of reducing the hardware added to the IC. The use of the cut-point circuit for eliminating hazards has the advantage of providing additional information from the cut-point MISR for observing and controlling the IC.

The present invention has the advantage of providing robust built-in self-testing of delay faults in integrated circuits. Hazardous nodes of the circuit are determined. A cutpoint is inserted to eliminate a hazard at the hazardous node. The signal on the cut-line is diverted to an observation point cutpoint MISR during testing of the circuit. The signal that normally would fan out from the cut-point is instead driven by a hazard-free pattern generated by an extra primary input, which is added to the circuit. A signature is computed at the output of the circuit and a second signature is computed at the observation point. Hazard-free input patterns are applied to the circuit and the computed signatures are compared to known good signatures. The system has the advantage of quickly determining delay faults for numerous integrated circuits.

While the invention has been described with reference to the preferred embodiment thereof, it will be appreciated by those of ordinary skill in the art that modifications can be made to the structure and form of the invention without departing from the spirit and scope thereof.

We claim:

1. A method for robust delay-fault testing of an integrated circuit comprising the steps of:

determining hazardous nodes in said integrated circuit;

inserting cut-points at said hazardous nodes for diverting input to said hazardous nodes to an observation point;

applying a succession of first input patterns to said integrated circuit on paths of said integrated circuit having said cut-points for generating cutpoint output responses;

applying a succession of second input patterns to said integrated circuit on paths of said integrated circuit without cut-points for generating integrated circuit output responses;

combining said cutpoint output responses from said integrated circuit received at said observation point of said integrated circuit to produce a first signature;

combining the integrated circuit output responses of said integrated circuit to produce a second signature; and, comparing said first and second signatures with a known correct first and second signature for said integrated circuit.

2. The method of claim 1 further comprising the steps of:

identifying XOR and equivalence gates in said integrated circuit, said XOR and equivalence gates including a first path from a first input node to an output node and a second path from a second input node to said output node; and modifying said XOR and equivalence gates so that said first path is inverted and said second path is non-inverted for eliminating hazards in said gates before said step of applying a succession of input patterns to said integrated circuit.

3. The method of claim 2 wherein said input patterns are hazard-free input patterns.

4. The method of claim 3 wherein said input patterns are generated by a modified Johnson counter.

5. The method of claim 4 wherein said step of inserting cut-points at said hazardous nodes includes determining common hazard nodes and inserting said cutpoint before said common hazardous node.

6. The method of claim 5 wherein a first and second of said common nodes is determined and wherein said method further comprises the step of:

inserting said cut-point between said first and second common nodes.

7. The method of claim 6 wherein said hazardous nodes are determined by a graph algorithm for tracing said integrated circuit.

8. The method of claim 6 wherein said hazardous nodes are determined by applying a hazard simulation algebra to said integrated circuit.

9. The method of claim 8 wherein said hazard simulation Algebra is chosen from the group comprising Chakraborty's 13 valued algebra, Smith Algebra, Reddy Algebra and Schultz et al. algebra.

10. A system for robust delay fault testing of an integrated circuit comprising:

inputs and outputs coupled to said integrated circuit;

means for determining hazardous nodes of said inputs in said integrated circuit;

means for inserting cut-points at said hazardous nodes for diverting said succession of first input patterns to said hazardous node to a cutpoint multiple input signature register;

means for generating a succession of first and second hazard free input patterns coupled to said inputs;

means for applying said succession of first input patterns to paths of said integrated circuit having cut-points to generate a cutpoint output response;

said cutpoint multiple input signature register receiving said cutpoint output response and combining said cutpoint output response to produce a first signature;

means for applying said succession of second input patterns to paths of said integrated circuit without cutpoints to generate integrated circuit output responses;

an output multiple input signature register receiving said integrated circuit output responses and combining said output responses to produce a second signature; and means for comparing said first and second signature with a known correct first and second signature for said integrated circuit.

11. The system of claim 10 wherein said cut-points are implemented in a NMOS MOSFET or CMOS MOSFET logic system.

12. The system of claim 10 further comprising:

means for determining XOR and equivalence gates in said integrated circuit, said XOR and equivalence gate including a first path from a first input node to an output node and a second path from second input node to said output node; and, means for modifying said XOR and equivalence gates in said integrated circuit so that said first path is inverted and said second path is non-inverted for eliminating hazards on said gates.

13. The system of claim 12 further comprising:

at least one buffer located between said inputs and said cut-points.

14. The system of claim 13 further comprising: a modified Johnson counter for generating said hazard-free input pattern.

15. The system of claim 14 wherein said modified Johnson counter includes one bit complementation.

16. The system of claim 15 wherein said modified Johnson counter includes a two bit complementation.

17. The system of claim 16 wherein said hazardous node is a reconverged fanout circuit, said fanout circuit having inputs with opposite polarity.

18. The system of claim 17 further comprising:

a phase-offset clock on said second MISR register for ensuring fair testing of path propagation delays.

19. A method for robust delay fault testing of an integrated circuit comprising the steps of:

determining hazardous nodes in said integrated circuit; and eliminating said hazardous nodes during testing of said circuit by inserting an exclusive OR gate at said hazardous node for eliminating opposite parity at said hazardous node during said testing.

* * * * *